(12) United States Patent
Hsieh

(10) Patent No.: US 11,324,134 B2
(45) Date of Patent: May 3, 2022

(54) DISPLAY PROTECTING DEVICE

(71) Applicant: KABO TOOL COMPANY, Taichung (TW)

(72) Inventor: Chih-Ching Hsieh, Taichung (TW)

(73) Assignee: KABO TOOL COMPANY, Taichung (TW)

( * ) Notice: Subject to any disclaimer, the term of this patent is extended or adjusted under 35 U.S.C. 154(b) by 0 days.

(21) Appl. No.: 17/096,976

(22) Filed: Nov. 13, 2020

(65) Prior Publication Data

US 2021/0176880 A1 Jun. 10, 2021

(30) Foreign Application Priority Data

Dec. 5, 2019 (TW) ................. 108144574

(51) Int. Cl.
*H05K 7/02* (2006.01)
*H05K 7/04* (2006.01)
*H05K 5/03* (2006.01)
*B25B 23/142* (2006.01)

(52) U.S. Cl.
CPC .......... *H05K 5/03* (2013.01); *B25B 23/1425* (2013.01)

(58) Field of Classification Search
CPC combination set(s) only.
See application file for complete search history.

(56) References Cited

U.S. PATENT DOCUMENTS

| 2005/0072278 | A1* | 4/2005 | Cutler | ................. B25B 23/1425 81/467 |
| 2011/0261510 | A1* | 10/2011 | Liu | ....................... G06F 1/1656 361/679.01 |
| 2012/0006161 | A1* | 1/2012 | Chen | ................... B25B 23/1425 81/479 |
| 2012/0255404 | A1 | 10/2012 | Chang | |

FOREIGN PATENT DOCUMENTS

| CN | 102179791 B | 8/2016 |
| TW | M381484 U | 6/2010 |
| TW | I609746 B | 1/2018 |

* cited by examiner

*Primary Examiner* — Hung S. Bui
(74) *Attorney, Agent, or Firm* — CKC & Partners Co., LLC

(57) ABSTRACT

A display protecting device is disposed on an electric wrench which has an opening. The display protecting device includes a printed circuit board, a display, a cover and a protection member. The printed circuit board is disposed in the opening. The display is disposed on the printed circuit board. The cover is located above the printed circuit board and covers on the opening. The protection member is assembled with the cover. The protection member includes a body and two wing portions. The body covers on the display. The two wing portions are connected to two sides of the body and cover on two sides of the display.

10 Claims, 8 Drawing Sheets

DISPLAY PROTECTING DEVICE

RELATED APPLICATIONS

This application claims priority to Taiwan Application Serial Number 108144574, filed Dec. 5, 2019, which is herein incorporated by reference.

BACKGROUND

Technical Field

The present disclosure relates to a display protecting device. More particularly, the present disclosure relates to a display protecting device applied on an electronic wrench.

Description of Related Art

A torque wrench is a common locking tool. Generally, it has a sleeve corresponding to a specific mechanical structure to apply a specific torque to the screw. There are strict requirements for the positioning accuracy, locking stability and reliability of screw locking. Especially important for heavy machinery (such as aircraft, various automobiles, ships, large machinery) with high safety requirements and needs for withstanding heavy loads and strong impacts. One of the key reasons why the torque wrench is popular is that the torque wrench can be preset with a preset torque value, and the torque wrench can perform the tightening torque operation until it reaches the preset torque value so as to control the torque. In order to know the torque change or the angle change during the screw locking process, a sensor is usually used to detect the torque change or the angle change, and a display is provided to display the torque value or the angle value. In the early days, a pointer and scales are used to display measurement of torque or angle in the display. Recently, it has been developed to directly display the torque value or angle value in a digital manner, so that the user can interpret intuitively and instantly.

The above-mentioned display is prone to damage by external impact due to its precision components. Especially when it is used for locking elements of heavy machinery, because the machinery is bulky and the screws are often used on non-planar surface, the wrench is often turned at a large angle. Therefore, the display is often shaken or impacted, and the damage rate is increased greatly.

Therefore, the above-mentioned display must be tightly protected to prevent shaking or impact, so as to avoid damaging the display, and the life of the display can be increased.

SUMMARY

According to one aspect of the present disclosure, a display protecting device is disposed on an electric wrench which has an opening. The display protecting device includes a printed circuit board, a display, a cover and a protection member. The printed circuit board is disposed in the opening. The display is disposed on the printed circuit board. The cover is located above the printed circuit board and covers on the opening. The protection member is assembled with the cover. The protection member includes a body and two wing portions. The body covers on the display. The two wing portions are connected to two sides of the body and cover on two sides of the display.

These and other features, aspects, and advantages of the present disclosure will become better understood with reference to the following description and appended claims.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
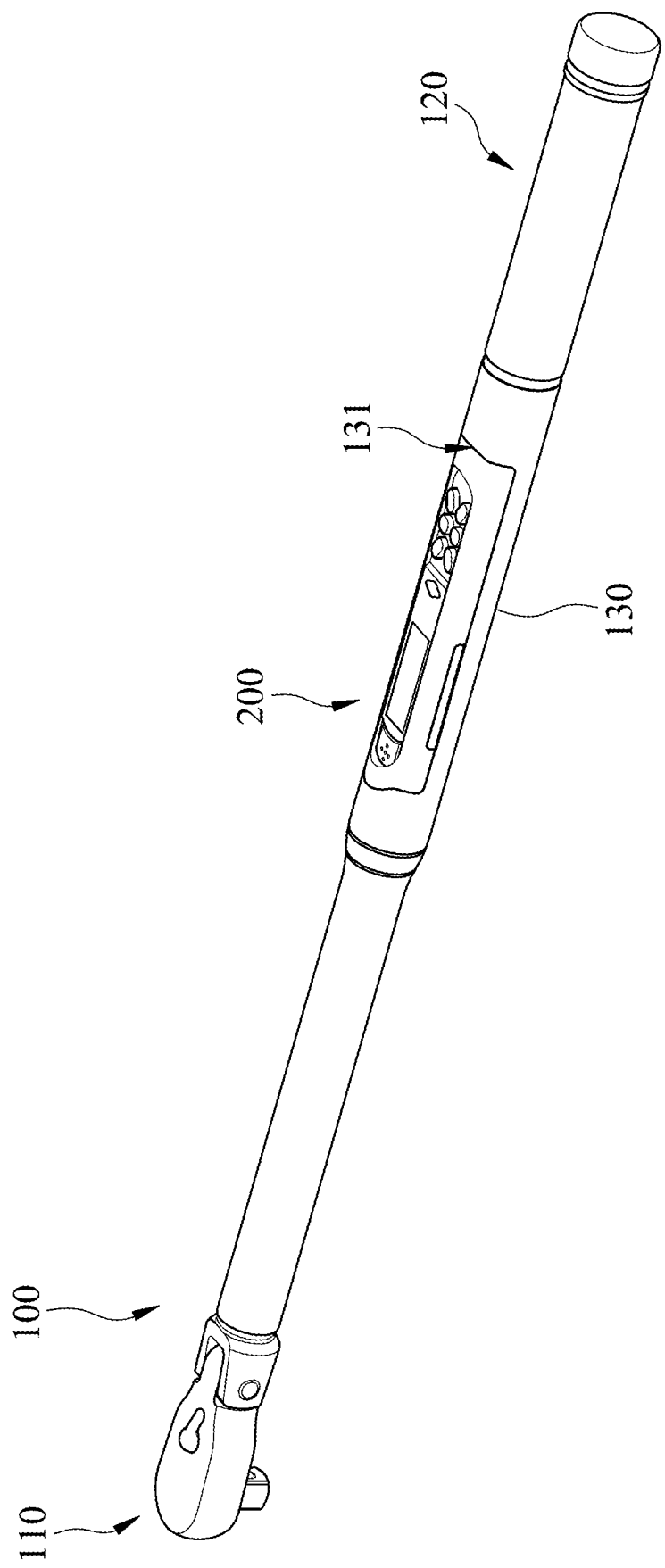
FIG. 1 is a three-dimensional view of a display protecting device according to one embodiment of the present disclosure assembled in an electric wrench.
Figure 2:
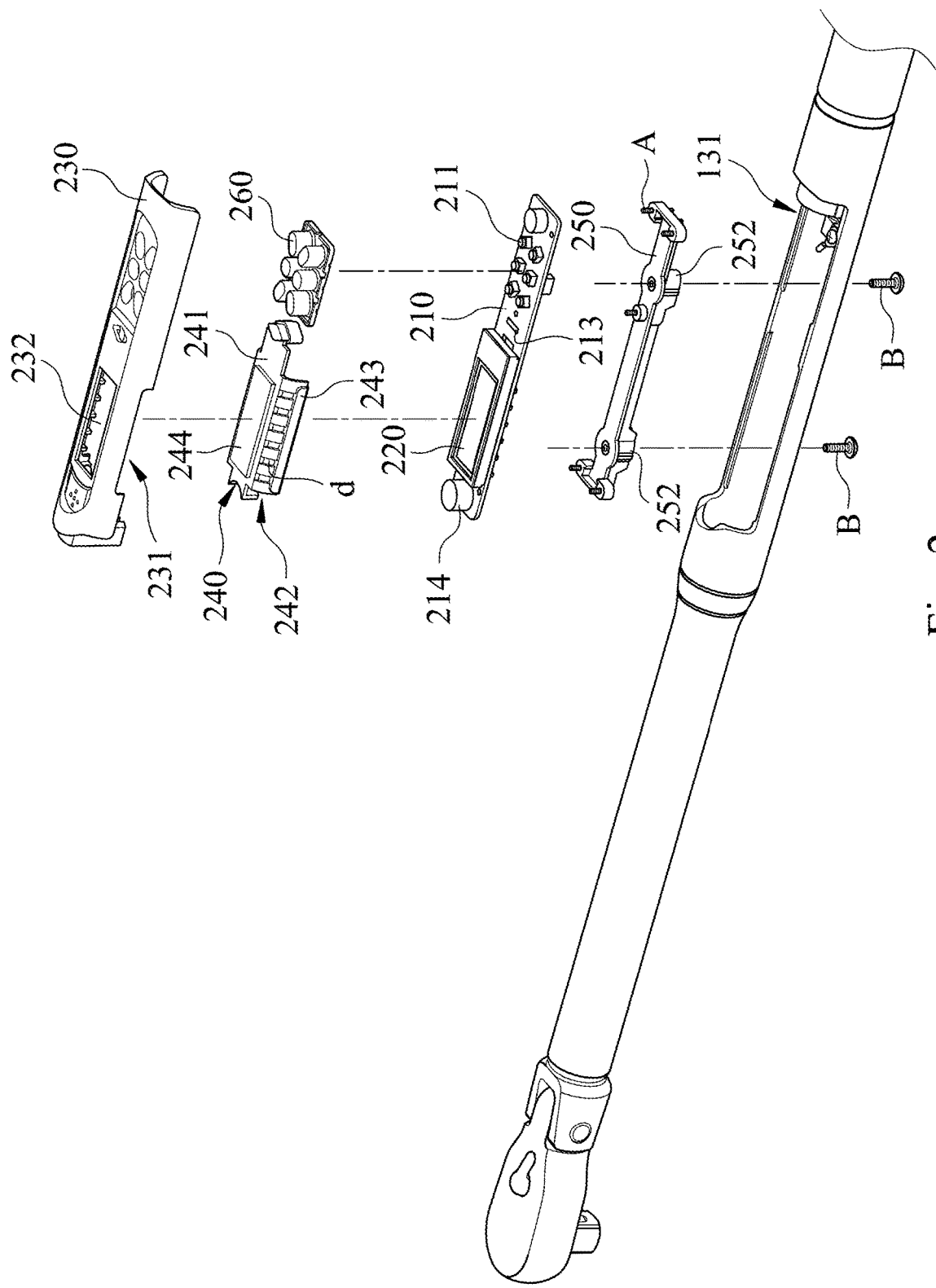
FIG. 2 is an exploded view of the display protecting device of FIG. 1.
Figure 3:
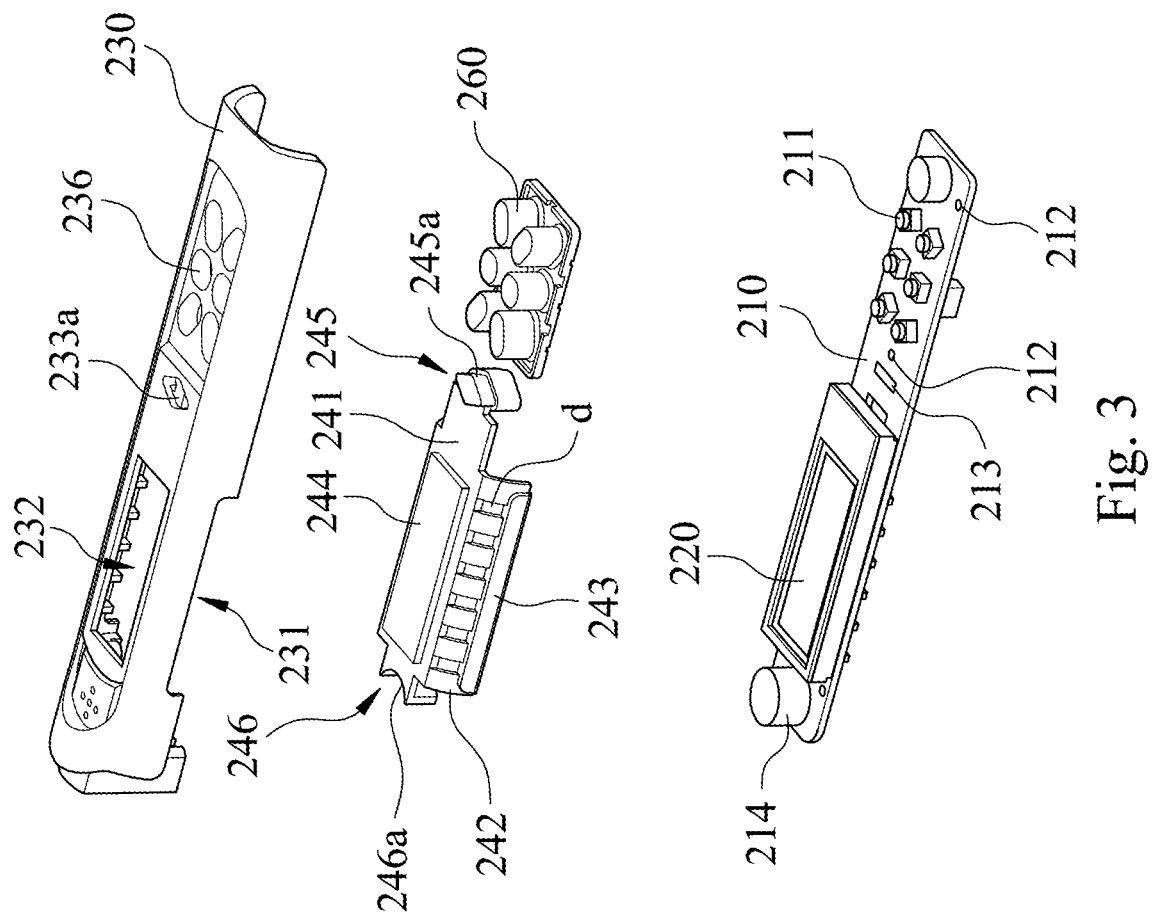
FIG. 3 is an enlarged view of elements of the display protecting device of FIG. 2.
Figure 4:
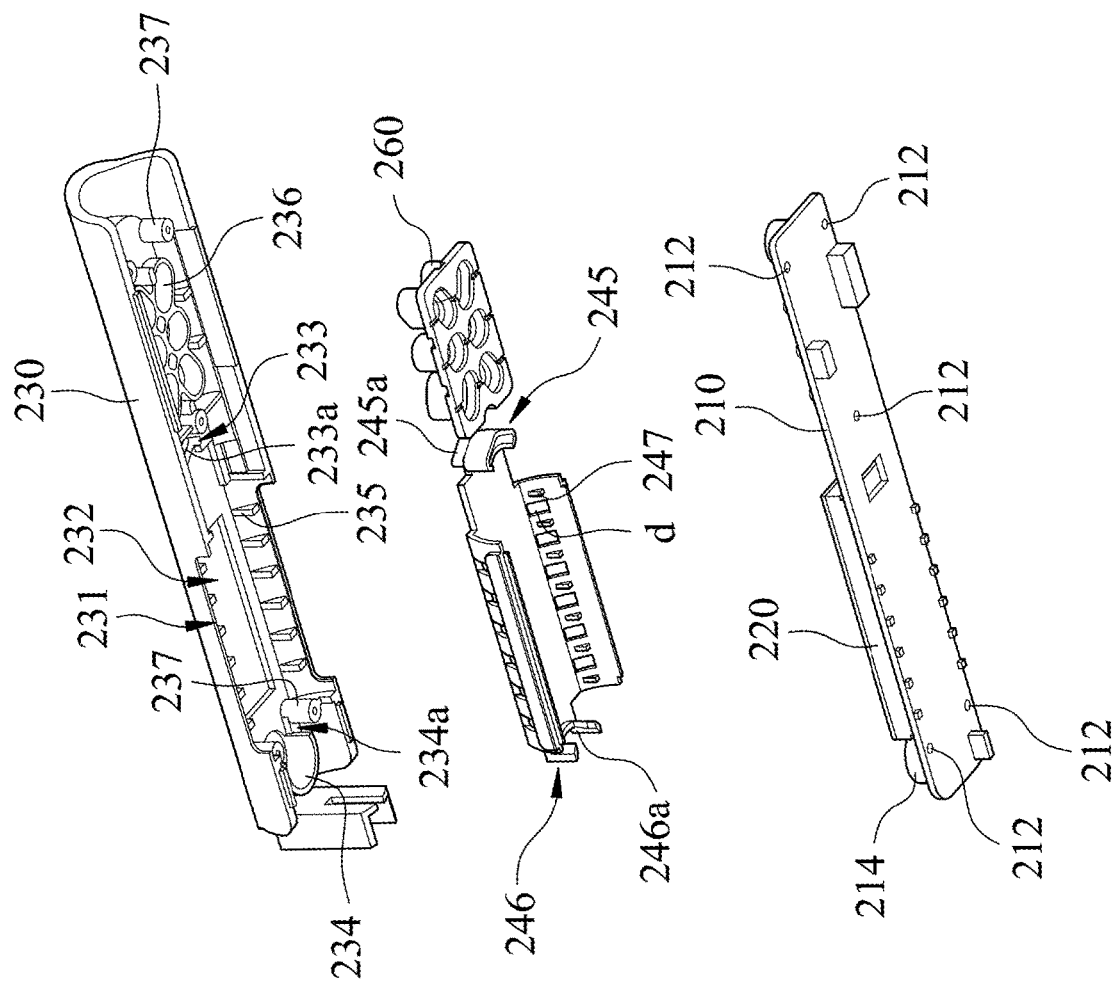
FIG. 4 is another enlarged view of elements of the display protecting device of FIG. 3.
Figure 5:
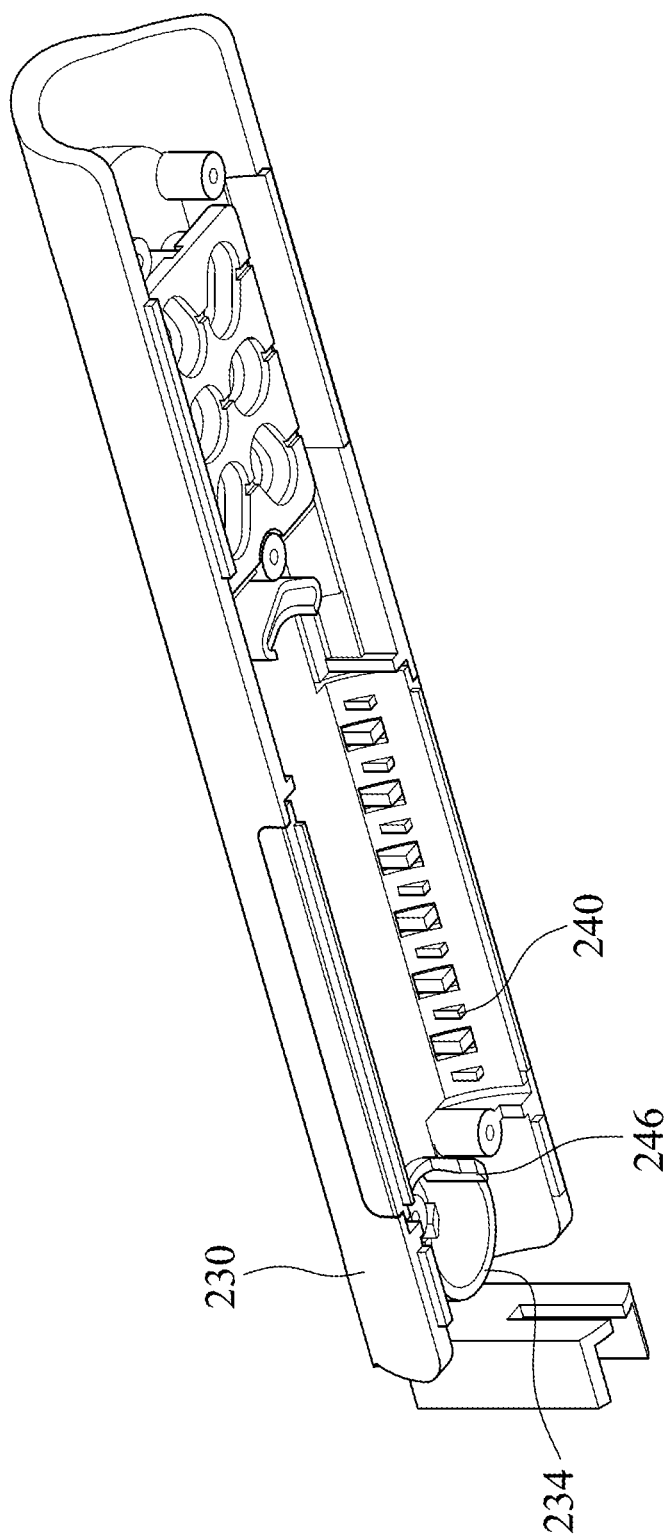
FIG. 5 is a combination view of a cover and a protection member of FIG. 2.

FIG. 1 is a three-dimensional view of a display protecting device 200 according to one embodiment of the present disclosure assembled in an electric wrench 100. FIG. 2 is an exploded view of the display protecting device 200 of FIG. 1. FIG. 3 is an enlarged view of elements of the display protecting device 200 of FIG. 2. FIG. 4 is another enlarged view of elements of the display protecting device 200 of FIG. 3. FIG. 5 is a combination view of a cover 230 and a protection member 240 of FIG. 2.

The display protecting device 200 is assembled on an electric wrench 100 and is integrated with a shaft 130 of the electric wrench 100. One end of the shaft 130 is connected to a driving portion 110, and the other end of the shaft 130 is connected to a holding portion 120. The electric wrench 100 has an opening 131. The display protecting device 200 includes a printed circuit board 210, a display 220, a cover 230 and a protection member 240. The printed circuit board 210 is disposed in the opening 131. The display 220 is disposed on the printed circuit board 210. The display 220 is for displaying a torque value or an angle value of the electric wrench 100. The printed circuit board 210 is equipped with a torque sensor, an angle sensor and/or a processor for analyzing and processing data. The cover 230 is located above the printed circuit board 210 and covers on the opening 131. In detail, the shape of the opening 131 is completely consistent with the shape of the cover 230, so that the cover 230 can be completely sealed with the opening 131. The dust-proof protection for the elements, such as the printed circuit board 210 and the display 220, can be achieved.

The protection member 240 is assembled with the cover 230. The protection member 240 includes a body 241 and two wing portions 242 connected to two sides of the body 241. The body 241 covers on the display 220. The two wing portions 242 cover on two sides of the display 220. In other words, the protection member 240 is located between the display 220 and the cover 230 and is assembled with the cover 230 to protect the display 220.

One end of the protection member 240 includes a first positioning structure 245, the other end of the protection member 240 includes a second positioning structure 246. The cover 230 includes a third positioning structure 233 and a fourth positioning structure 234. A position of the first positioning structure 245 corresponds to a position of the third positioning structure 233. A position of the second positioning structure 246 corresponds to a position of the fourth positioning structure 234. Therefore, when the protection member 240 is assembled with the cover 230, the first positioning structure 245 can be assembled with the third positioning structure 233 and the second positioning structure 246 can be assembled with the fourth positioning structure 234, so that the protection member 240 can be positioned and fixed on the cover 230.

The first positioning structure 245 can include a protruding portion 245a. The third positioning structure 233 can include a through hole 233a. When the first positioning structure 245 is assembled with the third positioning structure 233, the protruding portion 245a can be embedded in the through hole 233a. In detail, in one embodiment, the protruding portion 245a can be a lampshade. The electric wrench 100 can include a signal light 213 disposed on the printed circuit board 210. A position of the signal light 213 corresponds to the protruding portion 245a of the first positioning structure 245. When the display protecting device 200 is assembled, the signal light 213 is covered by the protruding portion 245a. Therefore, the user can know the state of the signal light 213 through the protruding portion 245a embedded in the through hole 233a.

The second positioning structure 246 can include an embedding block 246a. The fourth positioning structure 234 can include a groove 234a. When the second positioning structure 246 is assembled with the fourth positioning structure 234, the embedding block 246a can be embedded with the groove 234a. In detail, as shown in FIG. 4, the second positioning structure 246 can be an arc structure, and the fourth positioning structure 234 can be another arc structure. As shown in FIG. 5, when the second positioning structure 246 is assembled with the fourth positioning structure 234, the second positioning structure 246 and the fourth positioning structure 234 can form a complete circle structure. Further, the printed circuit board 210 can have a protruding member 214. When the display protecting device 200 is assembled, the protruding member 214 can be inserted in the circle structure formed by the second positioning structure 246 and the fourth positioning structure 234. Therefore, it is favorable for positioning the protection member 240 between the cover 230 and the printed circuit board 210, so as to enhance the structural stability of the display protecting device 200. Further, in the other embodiment, the protruding member 214 of the printed circuit board 210 can be an electronic element, such as a buzzer, but the present disclosure will not be limited therein.

Each side of the cover 230 can include an embedding groove 231. An embedding structure 243 is extended from each of the wing portions 242 of the protection member 240. When the protection member 240 is assembled with the cover 230, each of the embedding structures 243 can be embedded with each of the embedding grooves 231. Therefore, it is favorable for increasing the structural stability of the display protecting device 200.

Further, the body 241 of the protection member 240 can have a display portion 244. The cover 230 has a hollow portion 232 corresponding to the display portion 244. When the protection member 240 is assembled with the cover 230, the display portion 244 can be embedded with the hollow portion 232. In detail, the display portion 244 is protruded from the body 241, and the display portion 244 and the body 241 can be an integrated structure. Therefore, the protection member 240 can be assembled with the cover 230 by embedding the display portion 244 with the hollow portion 232. Further, the protection member 240 and/or the display portion 244 can be made of a transparent material. Therefore, the torque value or the angle value displayed on the display 220 can be seen by the user.

The protection member 240 is positioned and assembled with the cover 230, and provides a buffering and a shockproof function for the display 220. Each of the wing portions 242 of the protection member 240 has a plurality of gaps d. The cover 230 has a plurality of protruding ribs 235, and the protruding ribs 235 correspond to the gaps d. When the protection member 240 is assembled with the cover 230, each of the protruding ribs 235 is inserted in each of the gaps d. Each of the wing portions 242 of the protection member 240 has a plurality of ribs 247, the ribs 247 are alternately arranged with the gaps d. When the protection member 240 is assembled with the cover 230, the protruding ribs 235 of the cover 230 are alternately arranged with the ribs 247 of the protection member 240. Through the plurality of gaps d of the wing portions 242 of the protection member 240, the expansion and contraction of the gaps d can achieve buffering and shock-absorbing effect when being hit. The protruding ribs 235 of the cover 230 and the ribs 247 of the protection member 240 can provide auxiliary positioning effect. Further, the protection member 240 can made of a shock-absorbing material (such as Silicone, PU, PP, PE, EPDM, CR, NBR, NR, EVA, EPE, PET, PS) to enhance the shock-proof effect.

A plurality of button contacts 211 are disposed on the printed circuit board 210. Each of the button contacts 211 is covered by a button cover 260. A hole 236 is opened on the cover 230 corresponding to the position of each of the button covers 260. Each of the button covers 260 can pass through each of the holes 236 during assembling. By exposing the button covers 260, the user of the electric wrench 100 can adjust the torque value or the angle value displayed on the display 220 by pressing so as to adapt to various situations.

Figure 6:
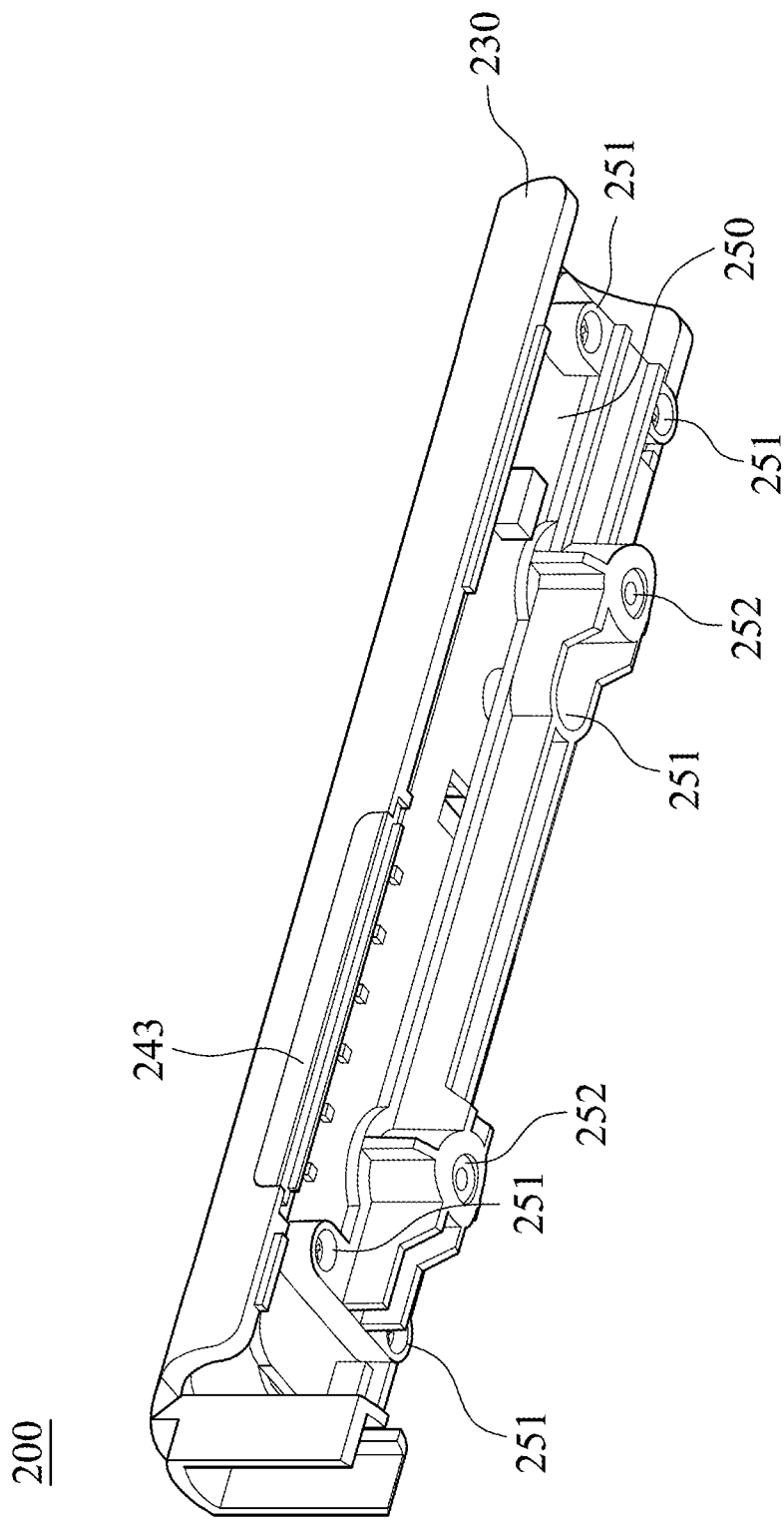
FIG. 6 is a combination view of the display protecting device of FIG. 2.
Figure 7:
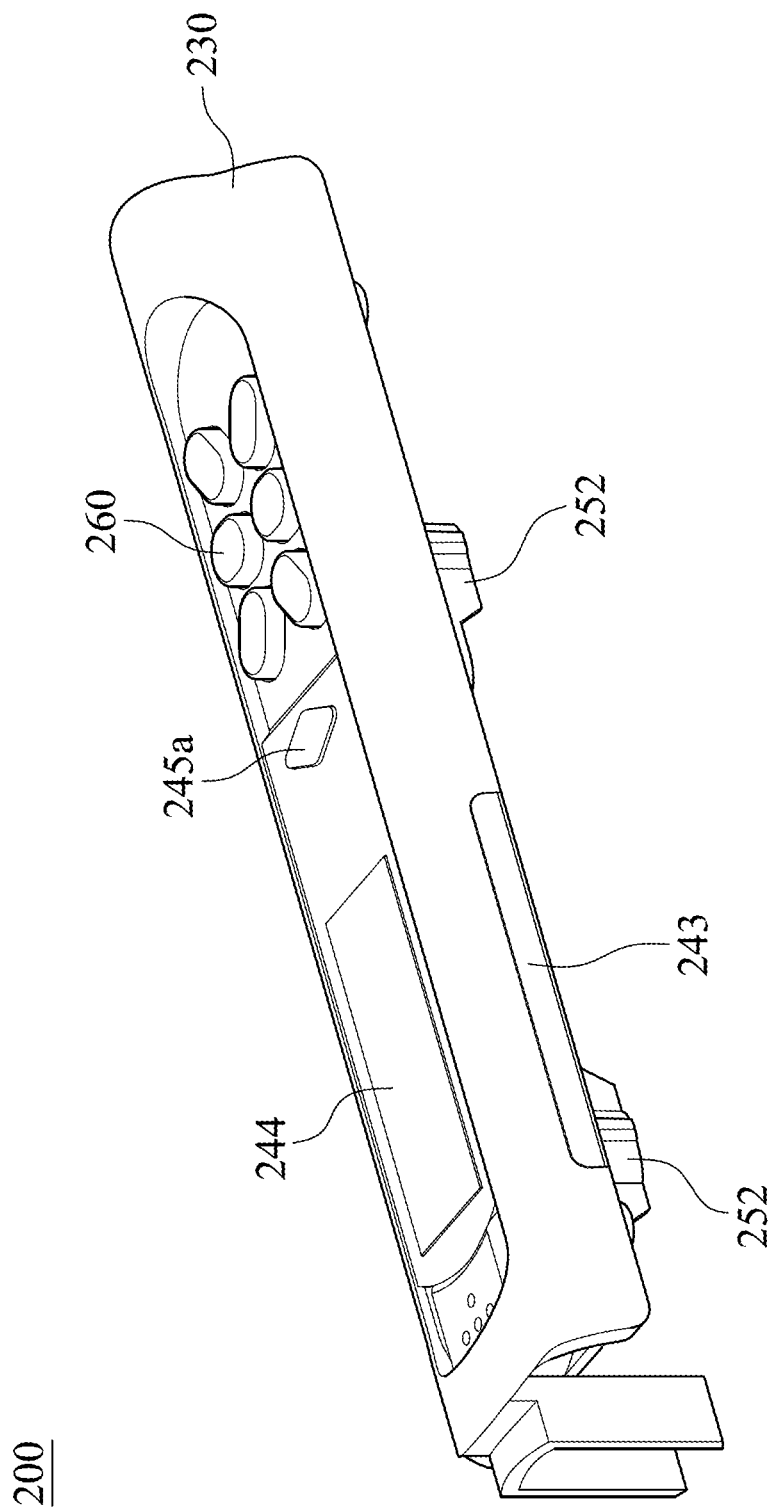
FIG. 7 is another combination view of the display protecting device of FIG. 6.
Figure 8:
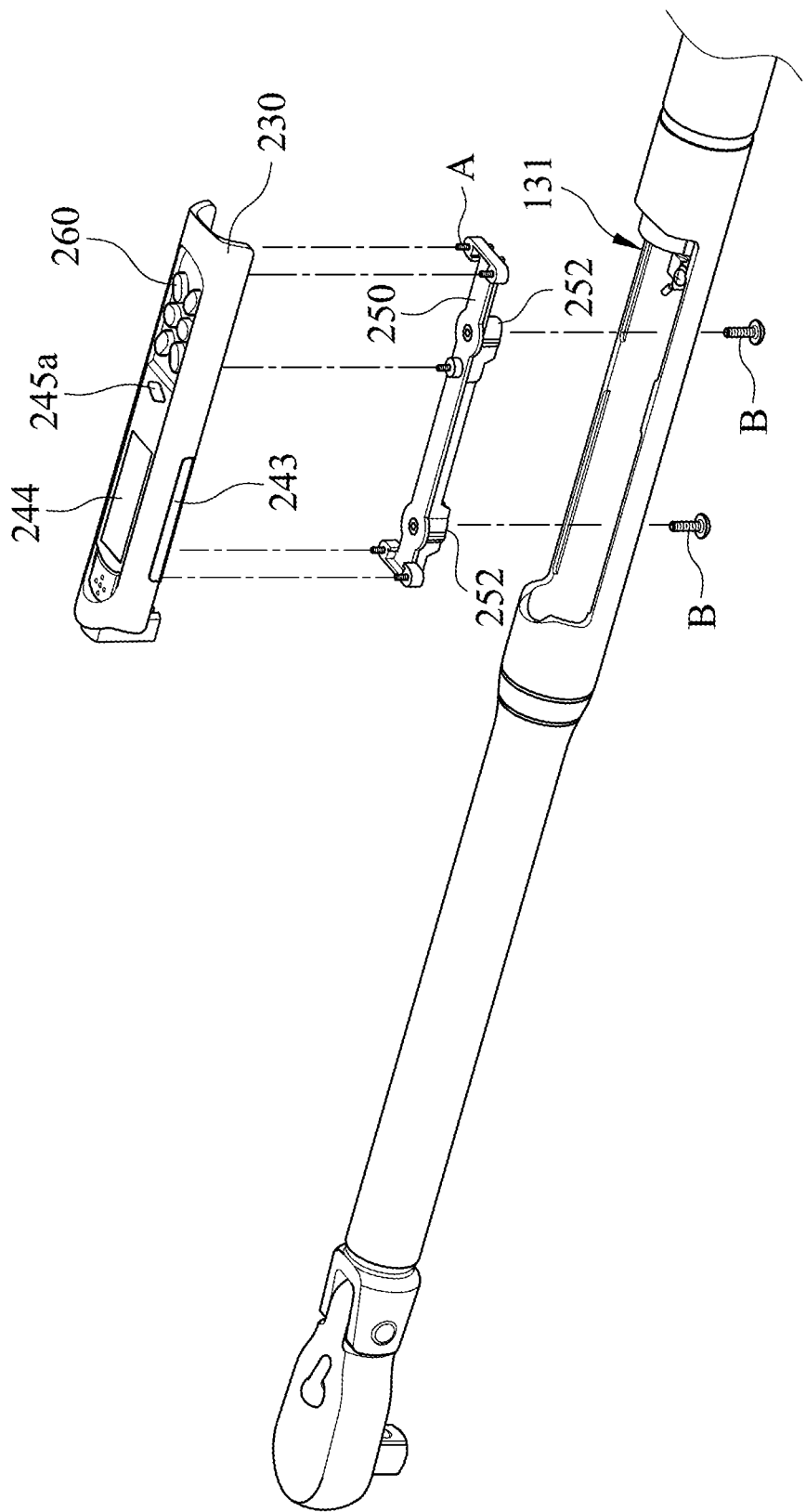
FIG. 8 is a schematic view of assembling process of the display protecting device and the electric wrench of FIG. 1.

FIG. 6 is a combination view of the display protecting device 200 of FIG. 2. FIG. 7 is another combination view of the display protecting device 200 of FIG. 6. FIG. 8 is a schematic view of assembling process of the display protecting device 200 and the electric wrench 100 of FIG. 1.

The display protecting device 200 can further include a bracket 250. The bracket 250 is located under the printed circuit board 210. The bracket 250 carries the printed circuit board 210 and fixes the printed circuit board 210 to the cover 230. In detail, screw holes 251 and screw holes 252 are disposed under the bracket 250. Screw holes 212 and screw holes 237 corresponding to the screw holes 251 and the screw holes 252 are also disposed on the printed circuit board 210 and the cover 230, respectively (please refer to FIGS. 3 and 4). During assembling, the screws A pass through the screw holes 251 of the bracket 250 and the screw holes 212 of the printed circuit board 210, and is locked to the screw holes 237 of the cover 230 to form the display protecting device 200 shown in FIGS. 5 and 6. Then the screws B are locked to the screw holes 252 of the bracket 250 to lock with the shaft 130 of the electric wrench 100, so as to form the complete electric wrench 100.

The present disclosure provides the display protecting device 200 which can be easily assembled on the electronic wrench 100. The protection member 240 is disposed between the cover 230 and the display 220. By the body 241 of the protection member 240 and the wing portions 242 connected to the two sides of the body 241, the buffering and shock-absorbing effect can be achieved, and the display 220 being damaged by external impact can be prevented.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A display protecting device, disposed on an electric wrench which has an opening, and the display protecting device comprising:
    a printed circuit board disposed in the opening;
    a display disposed on the printed circuit board;
    a cover located above the printed circuit board and covering on the opening; and
    a protection member assembled with the cover and comprising:
        a body covering on the display; and
        two wing portions connected to two sides of the body and covering on two sides of the display;
    wherein each of the wing portions of the protection member has a plurality of gaps, the cover has a plurality of protruding ribs, and the protruding ribs correspond to the gaps;
    wherein when the protection member is assembled with the cover, each of the protruding ribs is inserted in each of the gaps.

2. The display protecting device of claim 1, wherein each of the wing portions of the protection member has a plurality of ribs, and the ribs are alternately arranged with the gaps;
    wherein when the protection member is assembled with the cover, the protruding ribs of the cover are alternately arranged with the ribs of the protection member.

3. The display protecting device of claim 1, wherein the cover comprises at least one embedding groove disposed on at least one side of the cover, and the protection member comprises at least one embedding structure disposed on at least one of the two wing portions;
    wherein when the protection member is assembled with the cover, the at least one embedding structure is embedded with the at least one embedding groove.

4. The display protecting device of claim 1, wherein one end of the protection member comprises a first positioning structure, and the other end of the protection member comprises a second positioning structure; and
    the cover comprises a third positioning structure and a fourth positioning structure, a position of the first positioning structure corresponds to a position of the third positioning structure, and a position of the second positioning structure corresponds to a position of the fourth positioning structure;
    wherein the first positioning structure is assembled with the third positioning structure and the second positioning structure is assembled with the fourth positioning structure, so as to position and fix the protection member on the cover.

5. The display protecting device of claim 4, wherein the first positioning structure comprises a protruding portion, and the third positioning structure comprises a through hole;
    wherein when the first positioning structure is assembled with the third positioning structure, the protruding portion is embedded in the through hole.

6. The display protecting device of claim 4, wherein the second positioning structure comprises an embedding block, and the fourth positioning structure comprises a groove;
    wherein when the second positioning structure is assembled with the fourth positioning structure, the embedding block is embedded with the groove.

7. The display protecting device of claim 1, further comprising:
    a bracket located under the printed circuit board, and the bracket carries the printed circuit board and fixes the cover to the printed circuit board.

8. The display protecting device of claim 1, wherein the protection member is made of a shock-absorbing material.

9. The display protecting device of claim 1, wherein the protection member is made of a transparent material.

10. The display protecting device of claim 1, wherein the body of the protection member has a display portion, the cover has a hollow portion, and the hollow portion corresponds to the display portion;
    wherein when the protection member is assembled with the cover, the display portion is embedded with the hollow portion.

* * * * *